United States Patent [19]

Eguchi

[11] Patent Number: 5,238,865
[45] Date of Patent: Aug. 24, 1993

[54] PROCESS FOR PRODUCING LAMINATED SEMICONDUCTOR SUBSTRATE

[75] Inventor: Kouhei Eguchi, Chiyoda, Japan

[73] Assignee: Nippon Steel Corporation, Tokyo, Japan

[21] Appl. No.: 763,302

[22] Filed: Sep. 20, 1991

[30] Foreign Application Priority Data

Sep. 21, 1990 [JP] Japan .................................. 2-253453
Sep. 21, 1990 [JP] Japan .................................. 2-253454

[51] Int. Cl.$^5$ .......................................... H01L 21/302
[52] U.S. Cl. .......................................... 437/62; 437/86; 437/946; 437/974; 148/DIG. 12; 148/DIG. 135
[58] Field of Search ................. 437/66, 67, 70, 72, 437/974, 946, 62, 86; 148/DIG. 12, DIG. 135, DIG. 87

[56] References Cited

U.S. PATENT DOCUMENTS 4,784,970 11/1988 Solomon .................................. 437/974
5,169,472 12/1992 Goebel .......................... 148/DIG. 12

FOREIGN PATENT DOCUMENTS 0368584 5/1990 European Pat. Off. .............. 437/86
0004338 1/1987 Japan ...................................... 437/62
63-65648 3/1988 Japan .
0305534 12/1989 Japan ...................................... 437/62

*Primary Examiner*—Brian E. Hearn
*Assistant Examiner*—Tuan Nguyen
*Attorney, Agent, or Firm*—Cushman, Darby & Cushman

[57] ABSTRACT

A first semiconductor substrate provided with an oxide film having protruded portions on a principal surface thereof is laminated and thermally bonded to a second substrate having recessed portions corresponding to the protruded portions. Alternatively, a first semiconductor substrate provided with an oxide film having recessed portions formed on a principal surface thereof is laminated and thermally bonded to a second semiconductor substrate provided with an oxide film constituting protruded portions corresponding to the recessed portions. The thermally bonded semiconductor substrates are polished from the side of the semiconductor toward the oxide film, and the protruded portions of the oxide film are used as a stopper, thus enabling a semiconductor layer having a desired thickness to be formed on the oxide film.

15 Claims, 7 Drawing Sheets

PRIOR ART

PROCESS FOR PRODUCING LAMINATED SEMICONDUCTOR SUBSTRATE

BACKGROUND OF THE INVENTION

1. Field of the Invention

The present invention relates to a process for producing a laminated semiconductor substrate, and more particularly to a process for producing a laminated semiconductor substrate which is suitable for use in the production of a semiconductor-on-insulator (SOI) substrate through lamination.

2. Description of Related Art

An SOI substrate has hitherto been produced as follows (see, for example, Japanese Unexamined Patent Publication (Kokai) No. 63-65648).

At the outset, as shown in FIG. 1A, an SiO$_2$ film 2 is formed on a principal surface of a first silicon substrate 1 by thermal oxidation. Then, an SiO$_2$ film 5 is formed on a principal surface of a second silicon substrate 3.

Then, as shown in FIG. 1B, the principal surface of the first silicon substrate 1 is laminated on the principal surface of the second silicon substrate 3, and the laminate was then heat-treated to bond the silicon substrates to each other.

Then, as shown in FIG. 1C, the second silicon substrate 3 is polished from the reverse side thereof to form an SOI substrate while leaving the SiO$_2$ film 2 and the thin silicon film 3 as an active region.

In this process, however, it is difficult to monitor the degree of polishing in the step of final polishing, which makes it difficult to precisely control the thickness of the silicon film 3.

In order to solve this problem, the following means have been used.

At the outset, as shown in FIG. 2A, an SiO$_2$ film 2 is formed on the whole principal surface of a first silicon substrate 1 by thermal oxidation. Separately, part of a second silicon substrate 3 is thermally oxidized to locally form a SiO$_2$ film 4. The surface of the SiO$_2$ film 4 is protruded from the surface of the principal surface of the silicon substrate 3, and the interface of the SiO$_2$ film 4 and the silicon substrate 3 is located at a position deeper than the surface of the principal surface of the silicon substrate 3. The principal surface of the silicon substrate 3 is then oxidized.

Thereafter, as shown in FIG. 2B, the principal surface of the first silicon substrate 1 is laminated on the principal surface of the second silicon substrate 3, and the laminate is heat-treated to bond the substrates to each other.

Then, as shown in FIG. 2C, the second substrate 3 is polished from the reverse side thereof. In this case, since the polishing rate of the SiO$_2$ is considerably smaller than that of the silicon, the SiO$_2$ film 4 formed on the silicon substrate 3 serves as a stopper and the thickness of the silicon substrate 3 left as an active region on the SiO$_2$ films 2 and 5 can be made constant.

In the process shown in FIGS. 2A to 2C, however, since protrusions of the SiO$_2$ film 4 are present on the principal surface of the second silicon substrate 3, the lamination of the substrates to each other as shown in FIG. 2B causes voids to be formed around the protrusions, so that problems occur such that the bond deteriorates and the principal surface of the silicon substrate 3 around the protrusions cannot remain flat and thereby deflects to deteriorate the crystallinity of the silicon.

The present invention has been made in view of the above-described problems, and an object of the present invention is to provide a process for producing an SOI substrate that can control a silicon film to be served as an active region so as to have a constant thickness and enable an SOI substrate to be produced without detriment to the crystallinity and bonding property.

SUMMARY OF THE INVENTION

In order to attain the above-described object, according to a first embodiment of the present invention, there is provided a process for producing a laminated semiconductor substrate, comprising the steps of forming an oxide film on a principal surface of a first semiconductor substrate; removing part of said oxide film to form relatively protruded portions in said oxide film; forming recessed portions on a principal surface of a second semiconductor substrate having a principal surface and a reverse surface at positions corresponding to the protruded portions of said first semiconductor substrate, the recessed portions being complementary to said protruded portions; thermally oxidizing the whole principal surface of the second semiconductor substrate; laminating the principal surface of the first semiconductor substrate on the principal surface of the second semiconductor substrate so as to fit the protruded portions of the first semiconductor substrate into the recessed portions of the second semiconductor substrate and subjecting the resultant laminate to a heat treatment to bond the substrates to each other; and polishing said second semiconductor substrate from the reverse surface thereof until the protruded portions of the oxide film are exposed.

Similarly, according to a second embodiment of the invention of the present application, there is provided a process for producing a semiconductor substrate comprising the steps of forming an oxide film on a principal surface of a first semiconductor substrate; forming recessed portions on the surface of said oxide film; forming protruded portions complementary to said recessed portions through the use of an oxide film on a principal surface of a second semiconductor substrate at positions corresponding to the recessed portions of said first semiconductor substrate; laminating the principal surface of the first semiconductor substrate on the principal surface of the second semiconductor substrate so as to fit the protruded portions of the first semiconductor substrate into the recessed portions of the second semiconductor substrate and subjecting the resultant laminate to a heat treatment to bond the substrates to each other; and polishing said second semiconductor substrate from the reverse surface thereof until the protruded portions of the oxide film are exposed.

In the second embodiment of the invention, the protruded portions of the second semiconductor substrate can be formed, for example, by the following steps.

A second oxide film is formed on the whole principal surface of the second semiconductor substrate, a second oxidation-resistant insulating film is formed on the second oxide film, openings are formed on the oxidation-resistant insulating film at positions corresponding to the recessed portions of the first semiconductor substrate, the second oxide film is selectively oxidized through the use of the oxidation-resistant insulating film as a mask, and the oxidation-resistant insulating film is then removed.

In the first embodiment of the invention, since the second semiconductor substrate has recessed portions on the principal surface thereof at positions corresponding to protruded portions provided on the principal surface of the first semiconductor substrate, the lamination of the first and second semiconductor substrates to each other causes the principal surfaces of the substrates to be sufficiently bonded to each other. Therefore, neither void around the protrusion nor deflection of the principal surface of the second silicon substrate occurs.

In the second embodiment of the invention, since the first semiconductor substrate has recessed portions on the principal surface thereof at positions corresponding to protruded portions provided on the principal surface of the second semiconductor substrate, the lamination of the first and second semiconductor substrates to each other causes the principal surfaces of the substrates to be sufficiently bonded to each other. Therefore, neither void around the protrusion nor deflection of the principal surface of the second silicon substrate occurs.

Further, since the protrusions of the oxide film provided on the principal surface of the semiconductor substrate serves as a stopper, the semiconductor substrate left as an active region can be controlled so as to have a constant thickness.

DESCRIPTION OF THE PREFERRED EMBODIMENTS

An embodiment of the present invention will now be described by reference to FIGS. 3A to 3E.

Figure 1A:
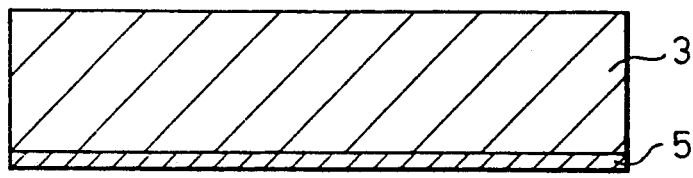
FIGS. 1A to 1C are cross-sectional views illustrating the steps of a conventional process for producing a laminated semiconductor substrate.
Figure 1B:
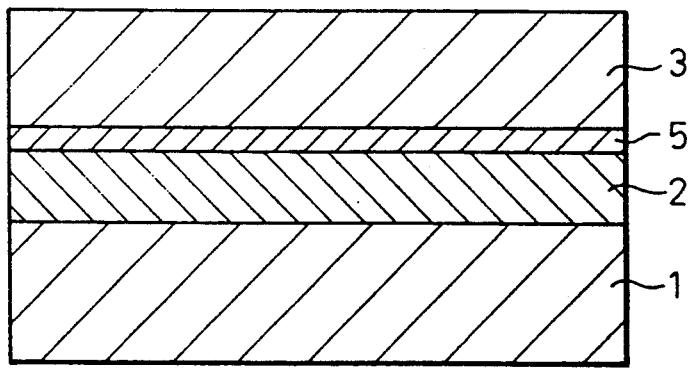
Figure 1C:
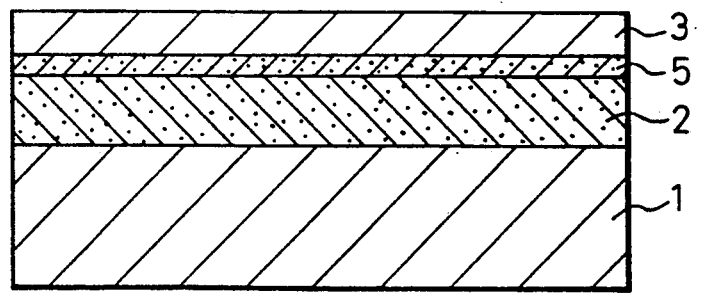
Figure 2A:
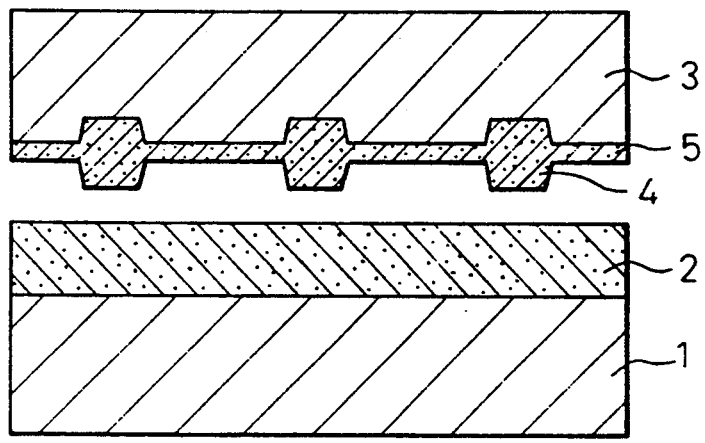
FIGS. 2A to 2C are cross-sectional views illustrating the steps of another conventional process for producing a laminated semiconductor substrate.
Figure 2B:
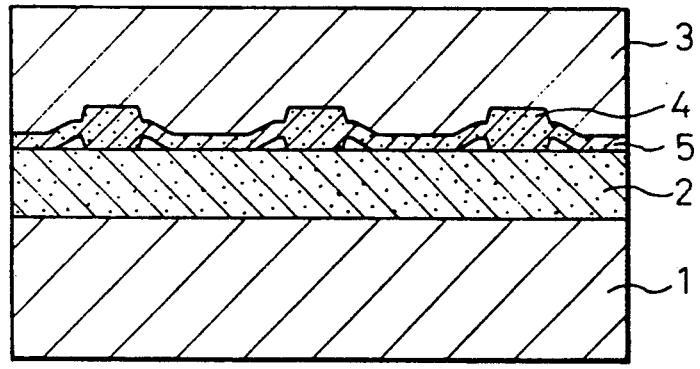
Figure 2C:
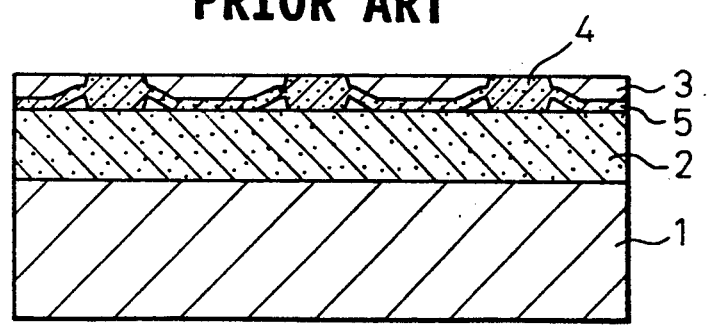
Figure 3A:
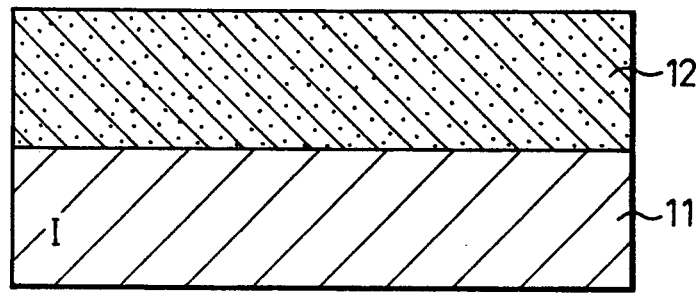
FIGS. 3A to 3E are cross-sectional views illustrating the steps of the process for producing a laminated semiconductor substrate according to an embodiment of the present invention.

At the outset, as shown in FIG. 3A, a 2.5 μm-thick SiO$_2$ film 12 is formed on a principal surface of a silicon substrate 11 by thermal oxidation.

Figure 3B:
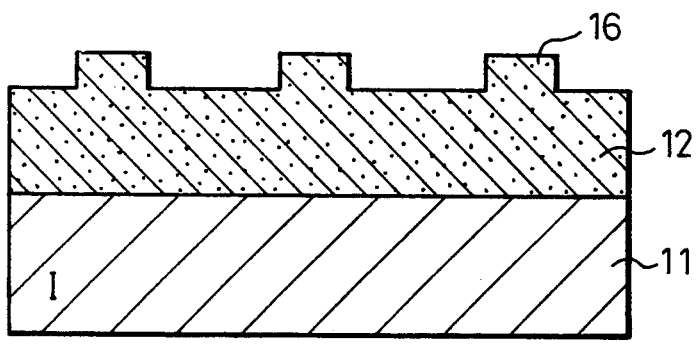

Then, a photoresist pattern is formed on the SiO$_2$ film 12, and the SiO$_2$ film 12 is selectively etched by a depth of generally 3000 to 10000 Å, for example, 5000 Å, in a hydrofluoric acid solution, and the photoresist is then removed to form a plurality of relatively protruded portions 16 in the SiO$_2$ film 12 as shown in FIG. 3B.

Figure 3C:
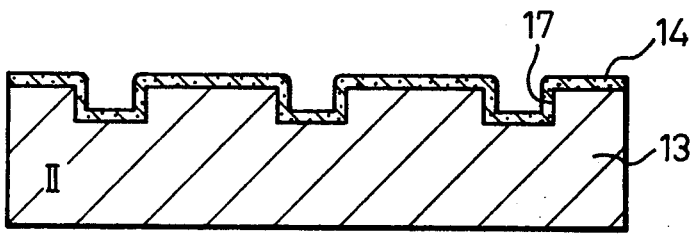

Separately, a photoresist pattern is formed on a principal surface of a second silicon substrate 13, the surface of the silicon substrate 13 is selectively etched by a depth of 5000 Å by plasma etching through the use of the photoresist pattern as a mask, and the photoresist is then removed to form recessed portions 17 on the surface of the silicon substrate 13 as shown in FIG. 3C. The positions of the recessed portions 17 formed on the surface of the silicon substrate 13 correspond to the positions of the protruded portions 16 formed in the SiO$_2$ film 12 on the first silicon substrate 11 when the principal surfaces of the first and second silicon substrates 11 and 13 are laminated on each other.

Thereafter, an about 1000 Å-thick SiO$_2$-film 14 is formed on a principal surface of a second silicon substrate 13 by thermal oxidation.

Figure 3D:
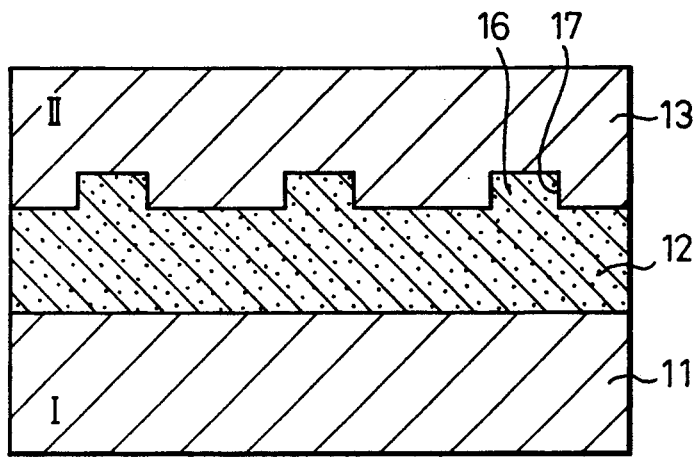

Then, as shown in FIG. 3D, the principal surface of the first silicon substrate 11 is laminated on the principal surface of the second silicon substrate 13, and the laminate is heat-treated to bond the substrates to each other. The heat treatment is conducted, for example, in an oxygen atmosphere at a temperature of 800° to 900° C. for one hour. At that time, the protruded portions 16 of the SiO$_2$ film 12 formed on the first silicon substrate 11 are fit into the recessed portions 17 formed in the second silicon substrate 13, so that the flat portion of the first silicon substrate 11 except for the protruded portions 16 is sufficiently adhered to the flat portion of the second substrate 13 except for the recessed portions 17. Further, since the second silicon substrate 13 does not deflect, the crystallinity is not spoiled.

Figure 3E:
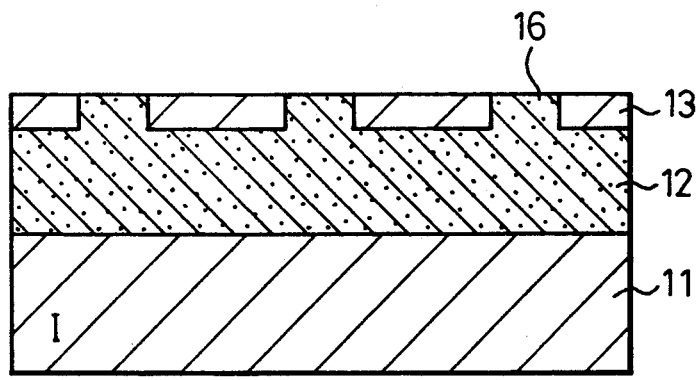

Thereafter, as shown in FIG. 3E, the second silicon substrate 13 is polished from the reverse surface thereof until part of the protruded portion 16 of the SiO$_2$ film 12 is exposed, thereby causing an about 5000 Å-thick silicon film 13 to be formed as an active region on the SiO$_2$ film 12.

With respect to a material used for polishing, for example, in the first stage of polishing, a dispersion of SiO$_2$ particles in water is used for the purpose of removing a spontaneously oxidized film on the reverse surface of the second silicon substrate 13, and in the second stage of polishing, a solution of an organic amine in water is used because it has a higher etching selectivity of Si with respect to SiO$_2$.

Another embodiment of the present invention will now be described by reference to FIGS. 4A to 4H.

Figure 4A:
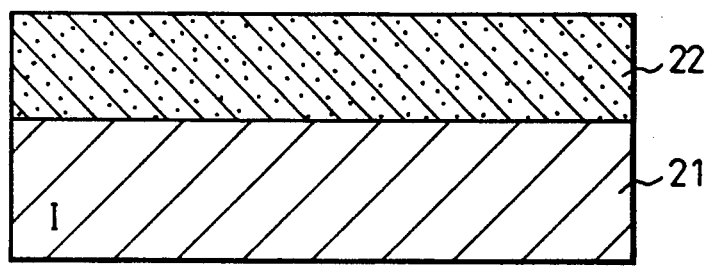
FIGS. 4A to 4H are cross-sectional views illustrating the steps of the process for producing a laminated semiconductor substrate according to another embodiment of the present invention.

As shown in FIG. 4A, a 2 μm-thick SiO$_2$ film 22 is formed on a principal surface of a silicon substrate 21.

Figure 4B:
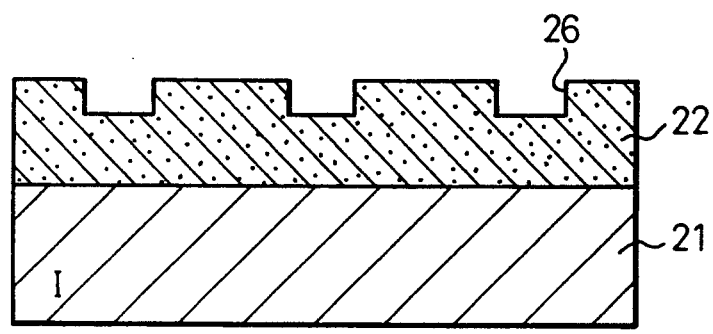

Then, a photoresist pattern is formed on the SiO$_2$ film 22, the SiO$_2$ film 22 is selectively etched by a depth of 5000 Å in a buffer hydrofluoric acid solution, and the photoresist is then removed to form a plurality of recessed portions 26 in the SiO$_2$ film as shown in FIG. 4B.

Figure 4C:
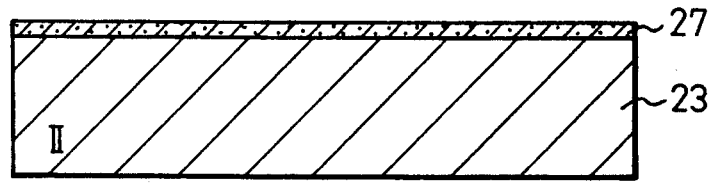

Separately, as shown in FIG. 4C, a 200 Å-thick SiO$_2$ film 27 is formed on a principal surface of a second silicon substrate 23 by thermal oxidation.

Figure 4D:
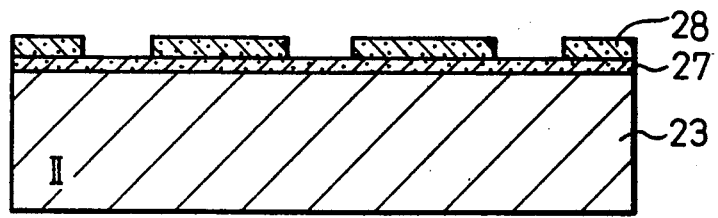

Then, as shown in FIG. 4D, a 1500 Å-thick Si$_3$N$_4$ film 28 is formed as an oxidation-resistant film on the SiO$_2$ film 27 by CVD, and the Si$_3$N$_4$ film 28 is patterned by the conventional procedure. In this case, the positions of openings in the Si$_3$N$_4$ film 28 correspond to the recessed portions 26 in the SiO$_2$ film 22 on the first silicon substrate 21 when the principal surface of the first silicon substrate 21 is laminated on the principal surface of the second substrate 23.

Figure 4E:
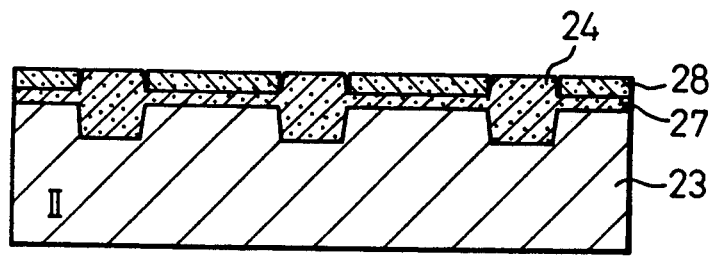

Then, as shown in FIG. 4E, a 1 μm-thick SiO$_2$ film 24 is formed only in the openings of the Si$_3$N$_4$ film 28 by thermal oxidation.

Figure 4F:
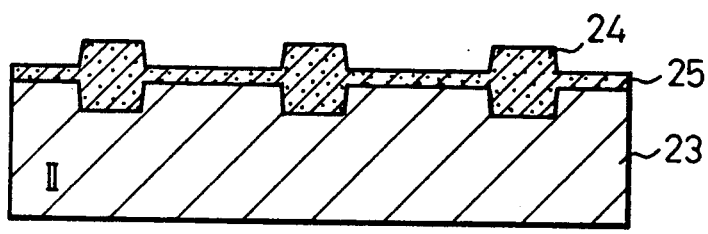

Thereafter, the Si$_3$N$_4$ film 28 is removed by plasma etching, and the SiO$_2$ film 27 is removed by means of buffer hydrofluoric acid. Then, an about 1000 Å-thick SiO$_2$ film 25 is formed on the second silicon substrate 23 by thermal oxidation. Thus, as shown in FIG. 4F, protruded portions of SiO$_2$ film 24 are formed on the principal surface of the second silicon substrate 23. At that time, the top of the protrusions of SiO$_2$ film 24 is protruded by about 4500 Å from the surface of the silicon surface on the principal surface of the second substrate 23.

Figure 4G:
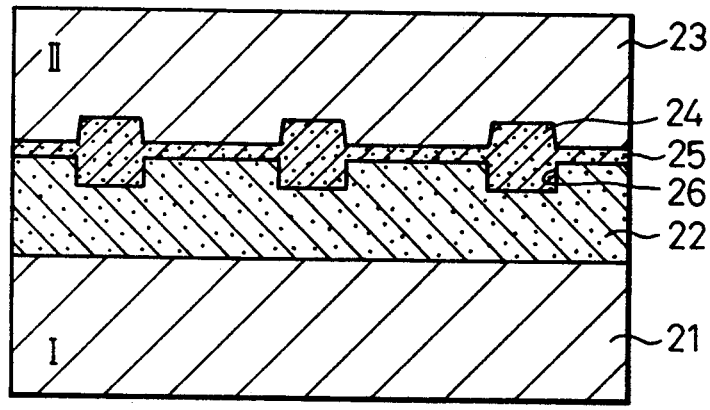

Then, as shown in FIG. 4G, the principal surface of the first substrate 21 is laminated on the principal surface of the second silicon substrate 23, and the laminate is heat-treated to bond the substrates to each other. At that time, since the protrusions of SiO$_2$ film 24 of the second silicon substrate 23 are fit into the recessed portions 26 of the SiO$_2$ film 22 on the first silicon substrate 21, the flat portion of the first silicon substrate 21 except for the recessed portion 26 is sufficiently adhered to the flat portion of the second substrate 23 except for the protruded portions. Further, since the second silicon substrate 23 does not deflect, the crystallinity is not spoiled.

Figure 4H:
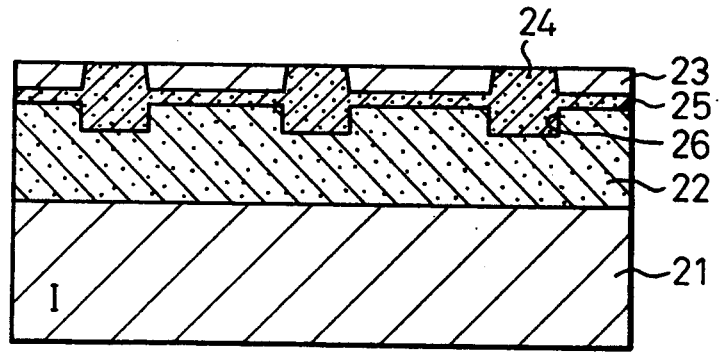

Thereafter, as shown in FIG. 4H, the second silicon substrate 23 is polished from the reverse surface thereof until part of the SiO$_2$ film 24 is exposed, thereby causing a 4500 Å-thick approx. silicon film 23 to be formed as an active region on the SiO$_2$ film 22.

Figure 5:
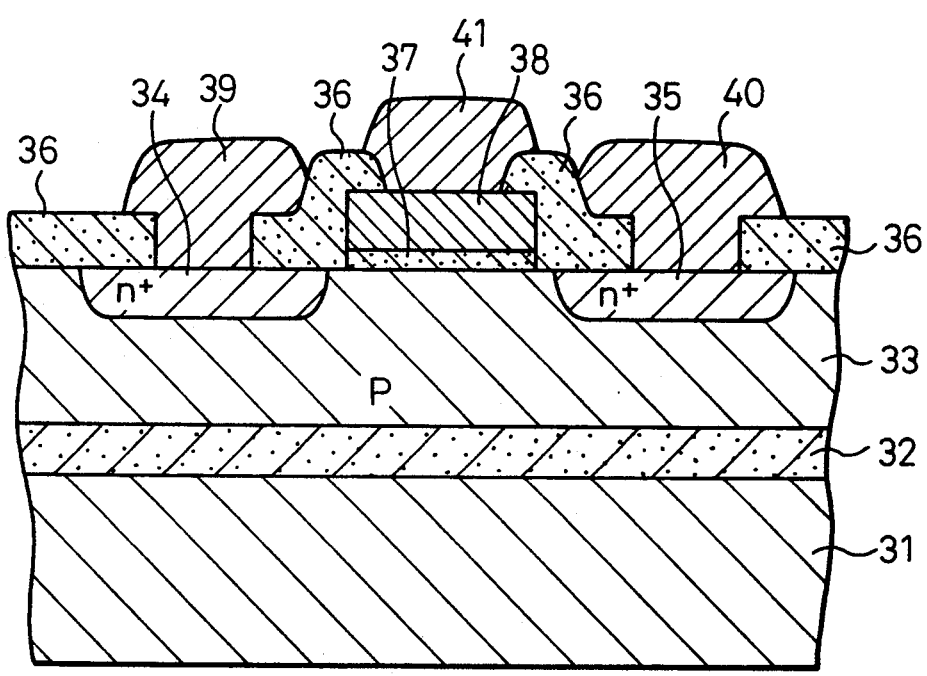
FIG. 5 is a cross-sectional view of a semiconductor device wherein use is made of an embodiment of the SOI structure according to the present invention.

FIG. 5 is an embodiment of a semiconductor device wherein use is made of the SOI structure according to the present invention. In the drawing, numeral 31 designates an Si substrate, numeral 32 an SiO$_2$ film, numeral 33 a p-type Si layer, numeral 34 an n$^+$-type drain diffusion region, numeral 35 an n$^+$-type drain diffusion region, numeral 36 an SiO$_2$ film, numeral 37 a gate SiO$_2$ film, numeral 38 a gate electrode, numeral 39 a source electrode, numeral 40 a drain electrode and numeral 41 a gate taking out electrode.

The semiconductor device having such an SOI structure has the effect of preventing the occurrence of latch-up and improving the operation rate through a reduction in the parasitic capacity.

I claim:

1. A process for producing a laminated semiconductor substrate, comprising the steps of:
    forming an oxide film on a principal surface of a first semiconductor substrate;
    removing part of said oxide film to form relatively protruded portions in said oxide film;
    forming recessed portions, complementary to said protruded portions, on a principal surface of a second semiconductor substrate having a principal surface and a reverse surface at positions corresponding to the protruded portion of said first semiconductor substrate;
    thermally oxidizing the whole principal surface of the second semiconductor substrate;
    laminating the principal surface of the first semiconductor substrate on the principal surface of the second semiconductor substrate so as to fit the protruded portions of the first semiconductor substrate into the recessed portions of the second semiconductor substrate and subjecting the resultant laminate to a heat treatment to bond the substrates to each other; and
    polishing said second semiconductor substrate from the reverse surface thereof until the protruded portions of the oxide film are exposed.

2. A process according to claim 1, wherein said first and second semiconductor substrates are a silicon substrate.

3. A process according to claim 2, wherein said second semiconductor substrate is bonded to said oxide film in an oxygen atmosphere at a temperature of 800° to 900° C.

4. A process according to claim 2, wherein said polishing is conducted by means of a dispersion of SiO$_2$ particles in water and then an aqueous organic amine solution.

5. A process according to claim 1, wherein said protruded portions of said oxide film on the first semiconductor substrate are formed through selective etching of said oxide film by photolithography.

6. A process according to claim 1, wherein said protruded portions have a height of 3000 to 10000 Å.

7. A process according to claim 1, wherein said recessed portions of said second semiconductor substrate are formed through selective etching of said second semiconductor substrate by photolithography.

8. A process for producing a semiconductor substrate comprising the steps of:
    forming an oxide film on a principal surface of a first semiconductor substrate;
    forming recessed portions on the surface of said oxide film;
    forming protruded portions complementary to said recessed portion through the use of an oxide film on a principal surface of a second semiconductor substrate at positions corresponding to the recessed portions of said first semiconductor substrate;
    laminating the principal surface of the first semiconductor substrate on the principal surface of the second semiconductor substrate so as to fit the protruded portions of the first semiconductor substrate into the recessed portions of the second semiconductor substrate and subjecting the resultant laminate to a heat treatment to bond the substrates to each other; and
    polishing said second semiconductor substrate from the reverse surface thereof until the oxide film is exposed.

9. A process according to claim 8, wherein said recessed portions of said oxide film on the first semiconductor substrate are formed through local etching of said oxide film by photolithography.

10. A process according to claim 8, wherein said protruded portions of said second semiconductor substrate are formed by the steps of:
    forming a second oxide film on the whole principal surface of the second semiconductor substrate, forming an oxidation-resistant insulating film on the second oxide film, forming openings on the oxidation-resistant insulating film at positions corresponding to the recessed portions of the first semiconductor substrate, locally oxidizing the second oxide film through the use of the oxidation-resistant insulating film as a mask to form protruded portions of the second oxide film and removing the oxidation-resistant insulating film.

11. A process according to claim 8, wherein said protruded portions have a height 3000 to 10000 Å.

12. A process according to claim 8, wherein said first and second semiconductor substrates are silicon substrates.

13. A process according to claim 12, wherein said second semiconductor substrate is bonded to said oxide film in an oxygen atmosphere at a temperature of 800° to 900° C.

14. A process according to claim 12, wherein said polishing is conducted first by means of a dispersion of SiO$_2$ particles in water and then by means of an aqueous organic amine solution.

15. A process according to claim 10 wherein said oxidation-resistant insulating film is a Si$_3$N$_4$ film.

* * * * *